United States Patent
Masuoka

[11] Patent Number: 5,994,743
[45] Date of Patent: Nov. 30, 1999

[54] SEMICONDUCTOR DEVICE HAVING DIFFERENT SIDEWALL WIDTHS AND DIFFERENT SOURCE/DRAIN DEPTHS FOR NMOS & PMOS STRUCTURES

[75] Inventor: Sadaaki Masuoka, Tokyo, Japan

[73] Assignee: NEC Corporation, Tokyo, Japan

[21] Appl. No.: 09/019,440

[22] Filed: Feb. 5, 1998

[30] Foreign Application Priority Data

Feb. 6, 1997 [JP] Japan ................................. 9-023604

[51] Int. Cl.$^6$ ................................................. H01L 29/76
[52] U.S. Cl. ........................................... 257/369; 257/900
[58] Field of Search .................................... 257/369, 408, 257/900

[56] References Cited

U.S. PATENT DOCUMENTS

| | | | |
|---|---|---|---|
| 4,577,391 | 3/1986 | Hsia et al. | 257/346 |
| 5,296,401 | 3/1994 | Mitsui et al. | 437/57 |

FOREIGN PATENT DOCUMENTS

| | | |
|---|---|---|
| 0 169 600 A2 | 1/1986 | European Pat. Off. . |
| 0 445 836 A1 | 9/1991 | European Pat. Off. . |
| 0 538 054 A1 | 4/1993 | European Pat. Off. . |
| 63-19690 | 1/1988 | Japan . |
| 3-41763 | 2/1991 | Japan . |
| 5-145030 | 6/1993 | Japan . |
| 2 257 563 | 1/1993 | United Kingdom . |

*Primary Examiner*—Mark V. Prenty
*Attorney, Agent, or Firm*—Foley & Lardner

[57] ABSTRACT

A CMOS device includes a first conductive type channel MOSFET having first side-wall spacers on side surfaces and having a source and drain region of an LDD structure, and a second conductive type channel MOSFET having second side-wall spacers on side surfaces and having a source and drain region of a single drain structure, wherein a width of the first side-wall spacers is larger than that of the second side-wall spacers, restraining the short channel effect and hot carrier effect as well.

5 Claims, 5 Drawing Sheets

SEMICONDUCTOR DEVICE HAVING DIFFERENT SIDEWALL WIDTHS AND DIFFERENT SOURCE/DRAIN DEPTHS FOR NMOS & PMOS STRUCTURES

BACKGROUND OF THE INVENTION

1. Field of the Invention

The present invention relates to a complementary metal oxide semiconductor (hereinafter, referred to as CMOS) device having an n-channel and a p-channel metal oxide semiconductor field effect transistors (or n-channel and p-channel MOSFETs) and manufacturing method of the same, more particularly to a CMOS device and manufacturing method thereof capable of restraining short channel effect of the n-channel and p-channel MOSFETs without increasing the number of photolithography processes.

2. Description of the Related Art

In general, when a gate length of a device is made short by critical dimension of the device, a threshold voltage may decrease or a short channel effect may remarkably arise. In one of the methods for restraining the short channel effect, there has been known that a source and drain region should be made shallow. However, in case of making the source and drain region shallow, there arise problems such that the process margin of device becomes narrow when forming a contact on the source and drain region. Further, it is difficult to make the silicide regions, and the source and drain regions are usually formed as an LDD (Lightly Doped Drain) structure, that is, the regions are formed by a low impurity concentration region having a shallow junction and a high impurity concentration region having a relatively deep junction.

This improves a short channel effect by the low impurity concentration region having the shallow junction and also permits the silicide formation and makes contact easy by means of the high impurity concentration region having the relatively deep junction. However, in order of forming both an n-channel MOSFET (hereinafter, referred to as nMOSFET) and a p-channel MOSFET (hereinafter, referred to as pMOSFET) as an LDD structure by an ordinary manufacturing method, a well region opposite to a substrate should be coated by a mask at each of the processes such as (1) form of n-type low concentration region, (2) form of p-type low concentration region, (3) form of n-type high concentration region and (4) form of p-type high concentration region, thus, the photolithography process must be carried out four times repeatedly to form a source and drain region, requiring a large number of process steps. Therefore, a method has been proposed that a pMOSFET should be fabricated with a single drain structure from which the short channel effects are not significant, and in which a source and drain region is formed only by two photolithography processes such a system is described with reference to the drawings below.

FIGS. 3(a) to 3(f) are sectional views of a device showing a manufacturing processes. As shown in FIG. 3(a), a field oxidation film 102 is formed on a p-type Si (Silicon) substrate 101 to form an n-type well region 103 and a p-type well region 104.

Thereafter, a gate oxidation film 105 is formed on the p-type Si substrate 101, as shown in FIG. 3(b), a gate electrode 106 of an nMOSFET and a gate electrode 107 of a pMOSFET both made of polysilicon are then formed.

Thereafter, As$^+$ (arsenic ion) 108 is ion-implanted onto an nMOSFET forming region and a pMOSFET forming region in low concentration (ex. 2 to $5 \times 10^{13}$ cm$^{-2}$ in dose) to form n-type low concentration regions 109 and 110 in both the nMOSFET forming region and the pMOSFET forming region as shown in FIG. 3(c).

As shown in FIG. 3(d), after forming an SiO$_2$ layer on the p-type Si substrate 101 by CVD (Chemical Vapor Deposition) method, the anisotropic etching process is applied thereto to form side-wall spacers 111 and 112 composed of SiO$_2$ on the side surfaces of gate electrodes 106 and 107 of nMOSFET and pMOSFET, respectively.

As shown in FIG. 3(e), after the nMOSFET is coated by a first mask layer 113 as a photoresist, B$^+$ (boron ion) 114 is ion-implanted onto the pMOSFET forming region in high concentration to thereby form a p-type high concentration source and drain region 115. At this time, the n-type low concentration region 110 is contained in the p-type high concentration source and drain region 115 to be inverted to a p-type region. After removing the first mask layer 113, as shown in FIG. 3(f), the pMOSFET region is coated by a second mask layer 117 as a photoresist, and As$^+$ 118 is ion-implanted onto the nMOSFET region in high concentration to form an n-type high concentration region 119. The second mask layer 117 is then removed, completing the manufacturing processes of a CMOSFET.

In addition, other CMOS devices and manufacturing methods have proposed such that an nMOSFET should only be made into the LDD structure while both an nMOSFET and a pMOSFET should be made into the LDD structure.

That is, The document of Japanese Laid-Open Patent Application No. Hei3-41763 discloses the following process: a gate electrode is formed on an nMOSFET forming region and a pMOSFET forming region and n$^-$-type region is formed in the nMOSFET forming region with a resist film coated on the pMOSFET forming region; side-wall spacers are formed on the side surfaces of gate electrode for the nMOSFET and an n-type impurity is doped into the nMOSFET forming region in high concentration to form an n$^+$-type region with a resist film coated on the pMOSFET forming region; and other side-wall spacers, width of which is wider than that of nMOSFET, are formed on the side surfaces of gate electrode of the pMOSFET forming region and a p-type impurity is doped into the pMOSFET forming region in high concentration to form a p$^+$-type source and drain region with a resist film coated on the nMOSFET forming region.

While the document of Japanese Laid-Open Patent Application No. Hei5-145030 discloses the following process: a gate electrode is formed on an nMOSFET forming region and a pMOSFET forming region, an n-type impurity is doped into both the regions in low concentration to form an n-type region on both the regions, and side-wall spacers are formed on the side surfaces of both the gate electrodes; a p-type impurity is ion-implanted onto the pMOSFET forming region in high concentration with a resist film coated on the nMOSFET to form a p$^+$-type region on the pMOSFET forming region; subsequently, the p-type impurity is ion-implanted thereon in an inclined direction to thereby invert the n$^-$-type region to a p$^-$-type region; and the n-type impurity is doped into the nMOSFET forming region in high concentration with a resist film coated on the pMOSFET to form an n$^+$-type region.

According to the examples described above, the nMOSFET is formed of the LDD structure while the pMOSFET is formed of the single drain structure as shown in FIG. 3 (f). However, since the short channel effect depends on a junction depth of the source and drain regions located close to the channel region in general, in the examples described above, the nMOSFET region is controlled by the short channel characteristic depending on a junction depth of the n-type low concentration region 109 and the pMOSFET region is controlled by that characteristic depending on a junction depth of the p-type high concentration source and drain region 115. Therefore, since the n-type low concentration region 109 should remain to a certain extent in the nMOSFET forming region, it is desirable that the side-wall spacers 111, which become masks in the ion-implantation of As$^+$ shown in FIG. 3(f), are formed thick in consideration of the width in a lateral direction of the n-type high concentration region 119. However, since the pMOSFET side is used by the process to be inverted by the ion-implantation of B$^+$ as shown in FIG. 3(e) after forming a conductive type of the n-type low concentration region as side-wall spacers, the p-type high concentration source and drain region should be formed to some extent of depth in case of forming the side-wall spacers in thick. To this end, the junction depth of the p-type high concentration source and drain region in the pMOSFET region becomes deeper than that of the n-type high concentration source and drain region in the nMOSFET region. As a result, the short channel effect of the pMOSFET becomes remarkable, so that the critical dimension of the gate length for the pMOSFET is limited.

SUMMARY OF THE INVENTION

It is therefore an object of the present invention to provide a semiconductor device and manufacturing method of the same capable of carrying out by only two photolithography processes for forming a source and drain region and restraining the short channel effect of n-channel and p-channel MOSFETs.

According to a first aspect of the present invention, there is provided a CMOS device including: a first conductive type channel MOSFET having first side-wall spacers on side surfaces thereof and having a source and drain region of an LDD structure; and a second conductive type channel MOSFET having second side-wall spacers on side surfaces thereof and having a source and drain region of a single drain structure, in which a width of the first side-wall spacers is larger than that of the second side-wall spacers.

According to a second aspect of the present invention, there is provided a method of manufacturing the CMOS device including the steps of: (1) forming first and second gate electrodes on first and second conductive type semiconductor regions through a gate insulation film, respectively; (2) doping a first conductive impurity into the first and second conductive type semiconductor regions in low concentration with use of the first and second gate electrodes as mask to form a first conductive type low concentration region within surface areas of the first and second conductive type semiconductor regions at both sides of the first and second gate electrodes; (3) forming an insulation film entirely and carrying out an etch back to form first and second side-wall spacers on side surfaces of the first and second gate electrodes, respectively; (4) laminating the first conductive type semiconductor region by a first mask and doping a first conductive type impurity thereinto in high concentration with use of the first mask, the first gate electrode and the first side-wall spacers as mask to form a first conductive type high concentration region within the surface area of the second conductive type semiconductor region at outside of the first side-wall spacers; and (5) applying an isotropic etching treatment to surfaces of the second side-wall spacers with the second conductive type semiconductor region laminated by a second mask to reduce a thickness of the second side-wall spacers, thereafter, doping a second conductive type impurity thereinto in high concentration with use of the second mask, the second gate electrode and the second side-wall spacers as mask to form a second conductive type high concentration region within surface area of the first conductive type semiconductor region at an outside of the second gate electrode. The method of manufacturing the CMOS device may be carried out in the order of the steps described above and may also be carried out by the order switched around the step (4) and step (5).

In the process of manufacturing a CMOS device for forming nMOSFET of the LDD structure and pMOSFET of the single drain structure, since the ion-implantation is carried out to form the p-type source and drain region after forming the side-wall spacers of the pMOSFET, width of which is smaller than those of the nMOSFET, the conductive type of n-type low concentration region (LDD structure) can be inverted even if the source and drain region of pMOSFET may be relatively shallow. Thus, the junction depth of the source and drain region in pMOSFET can be made shallow or equal to that of the source and drain region in nMOSFET, restraining the short channel effect of pMOSFET to achieve a fine or critical dimension of device. Furthermore, the LDD structure (or n-type low concentration region) in the nMOSFET is sufficiently secured, restraining the short channel effect and hot carrier effect as well.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

FIGS. 1(a) to 1(f) are sectional views showing the order of a manufacturing process of a CMOS device in an embodiment of the present invention.

Figure 1A:
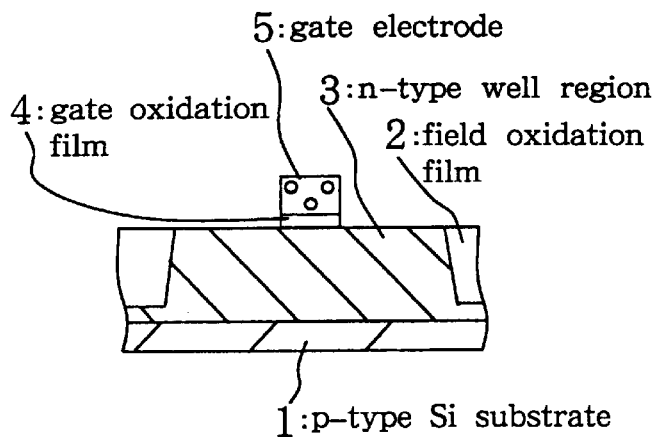
FIGS. 1(a) to 1(f) are sectional views showing a manufacturing process of a CMOS device in an embodiment of the present invention.
Figure 1D:
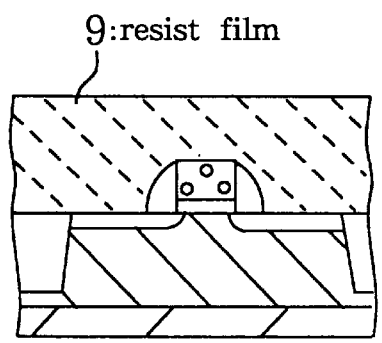

As shown in FIG. 1(a) first, a field oxidation film 2 is formed on a p-type Si substrate 1 by a well-known process to determine regions of the device. A p-type well region (not shown in the drawing) and an n-type well region 3 are then formed. Subsequently, after forming a gate oxidation film 4 by the thermal oxidation method, a non-doped polysilicon is deposited thereon by the CVD method, and a gate electrode 5 is formed by a photolithography process and an etching process.

Figure 1B:
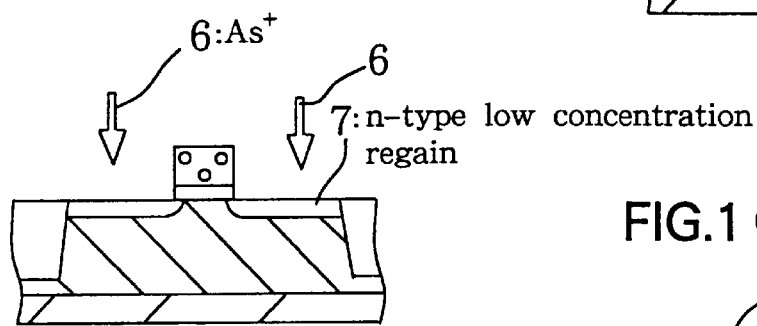
Figure 1E:
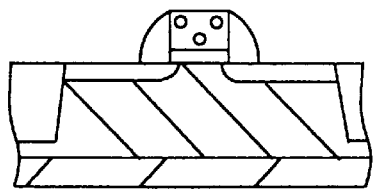
Figure 1C:
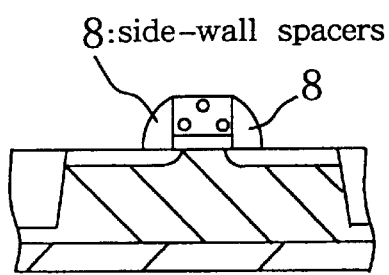
Figure 1F:
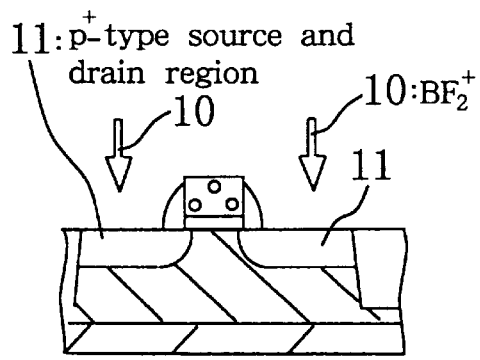

After that, an n-type impurity or As$^+$ (arsenic ion) 6 is ion-implanted thereon with use of masks of the gate electrode 5 and the field oxidation film 2 to form an n-type low concentration region 7 as shown in FIG. 1(b). At this time, an n-type low concentration region is also formed at a p-type well region which is not shown in the drawing. Heat treatment is then applied thereto to activate the implanted ion seed.

Subsequently, after forming an insulation film or SiO$_2$ film on the entire surface of p-type Si substrate 1 by the CVD method, an anisotropic etching process is carried out and side-wall spacers 8, 8 are formed on the side surfaces of gate electrode 5.

A pMOSFET forming region is then coated by a resist film 9 as shown in FIG. 1(*d*), and an n-type impurity is ion-implanted onto an nMOSFET (not shown in the drawing) to form an n-type high concentration region.

Thereafter, the resist film 9 is peeled off and the nMOSFET forming region, which is not shown in the drawing, is coated by a resist film, and the surfaces of side-wall spacers 8, 8 are then etched by an isotropic etching process to reduce the thickness of side-wall spacers 8, 8 as shown in FIG. 1(*e*). Before the isotropic etching process, an ion seed or $BF_2^+$ may be ion-implanted onto the side-wall spacers 8, 8 in an inclined direction by a low energy level to make coarse surfaces of the spacers. A wet etching method may also be used by dilute hydrogen fluoride as isotropic etching process.

As shown in FIG. 1(*f*), a p-type impurity ion or $BF_2^+$ 10 is then ion-implanted thereon to form a $p^+$-type source and drain region 11. With the ion-implantation for forming the source and drain region, the n-type low concentration region 7 can be inverted to a p-type low concentration region. Activated heat treatment is then applied thereto to activate the implanted ion.

According to the manufacturing method described above, when forming the $p^+$-type source and drain region 11 in the case of pMOSFET, the width of side-wall spacers 8, 8 are made small, as shown in FIG. 1(*f*), therefore, the conductive type of n-type low concentration region 7 can be inverted without ion-implanting a p-type impurity thereon and making it deep. Thus, the junction depth of $p^+$-type source and drain region 11 can be made shallow, restraining the short channel effect. While in the case of nMOSFET, the width of side-wall spacers are made sufficiently larger to eventually form a desirable length of the n-type low concentration region 7 as an LDD structure region, restraining the short channel effect and hot-carrier effect as well.

Figure 2:
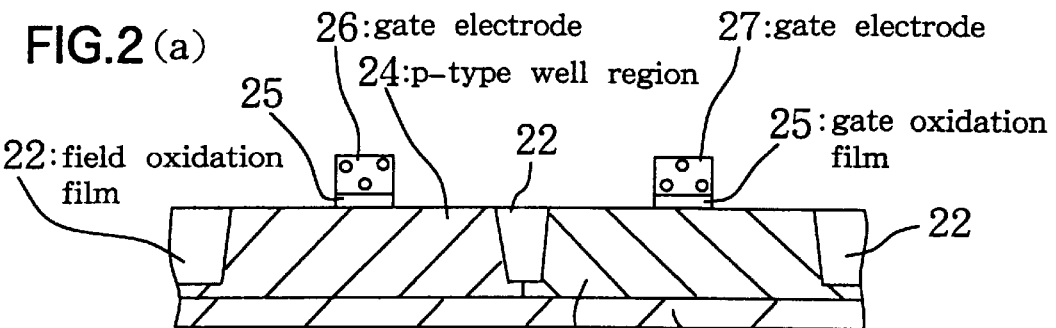
FIGS. 2(a) to 2(g) are sectional views showing a manufacturing process of a CMOS device in another embodiment of the present invention.
Figure 2:
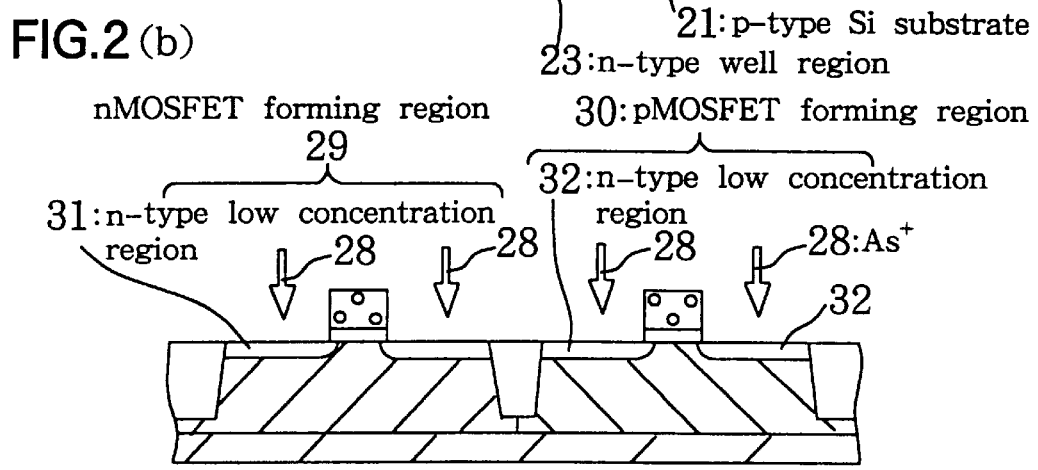
Figure 2:
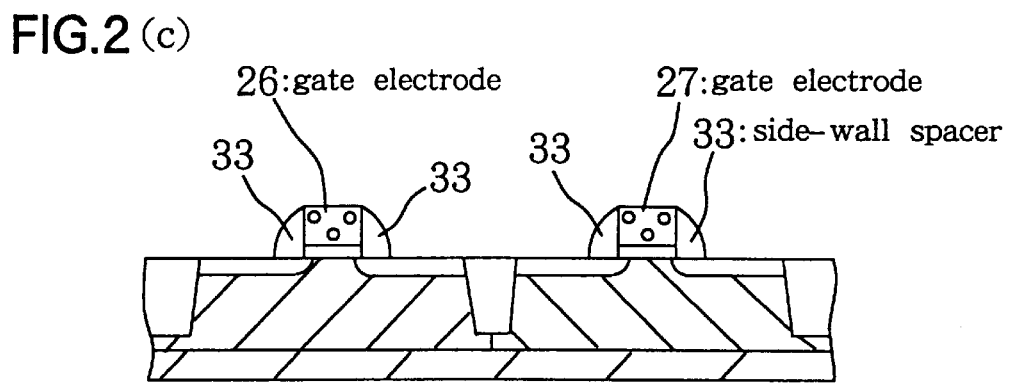
Figure 2:
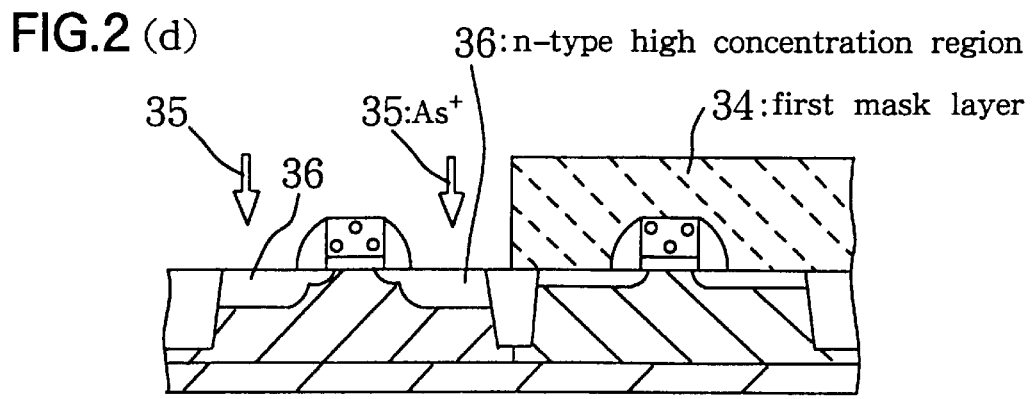
Figure 2:
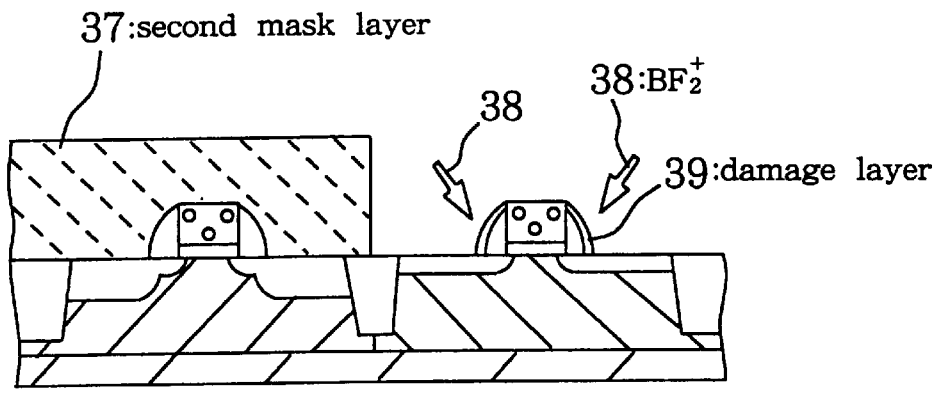
Figure 2:
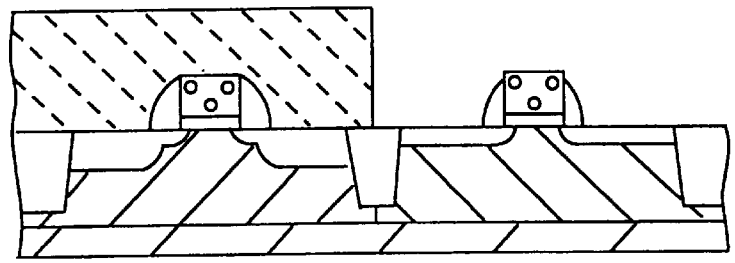
Figure 2:
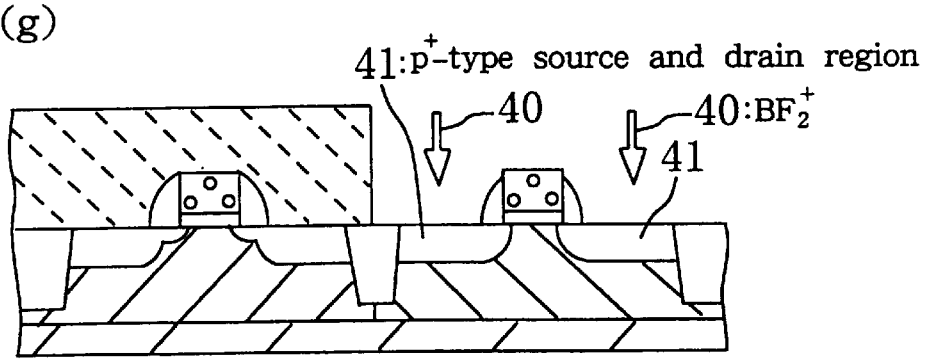
Figure 3:
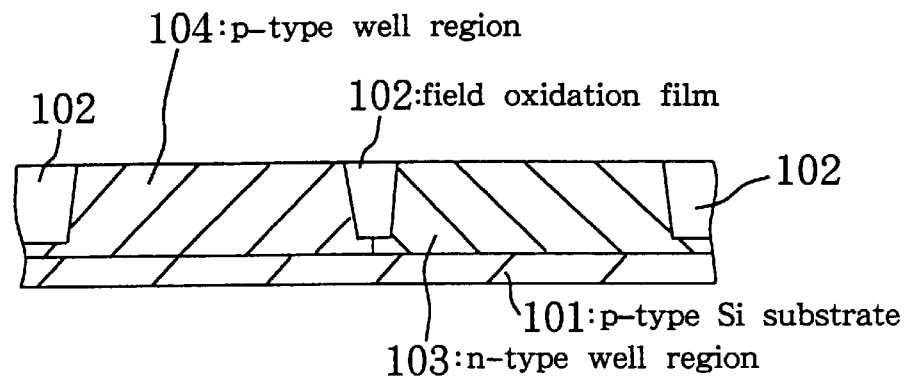
FIGS. 3(a) to 3(f) are sectional views showing a manufacturing process of a CMOS device for explaining a related art.
Figure 3:
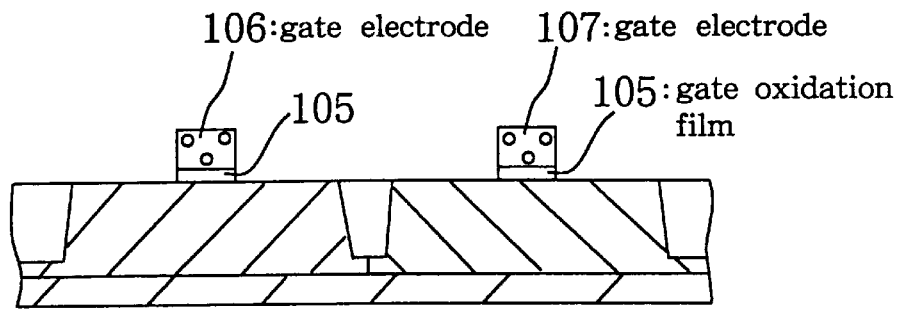
Figure 3:
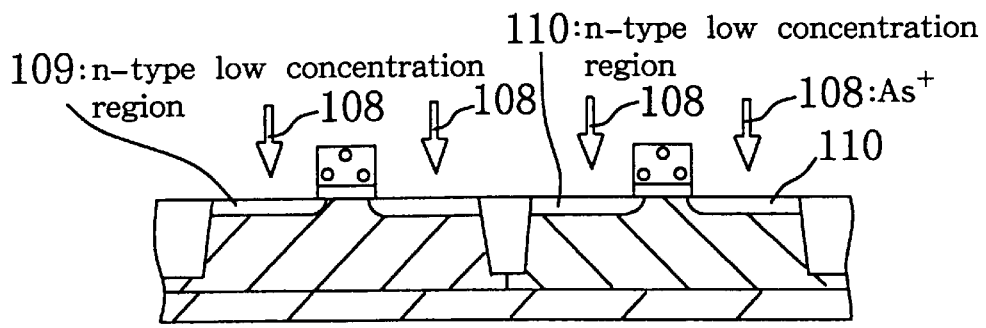
Figure 3D:
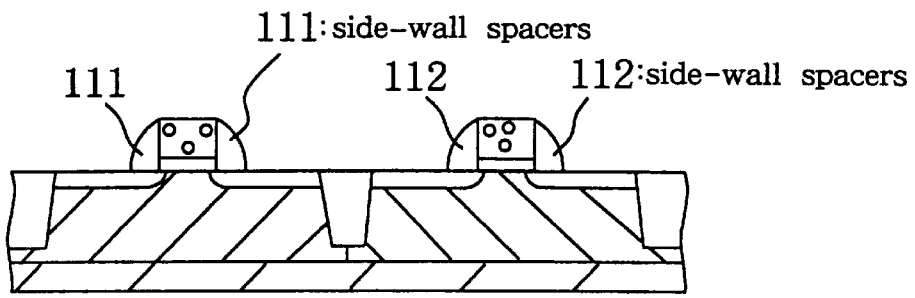
Figure 3E:
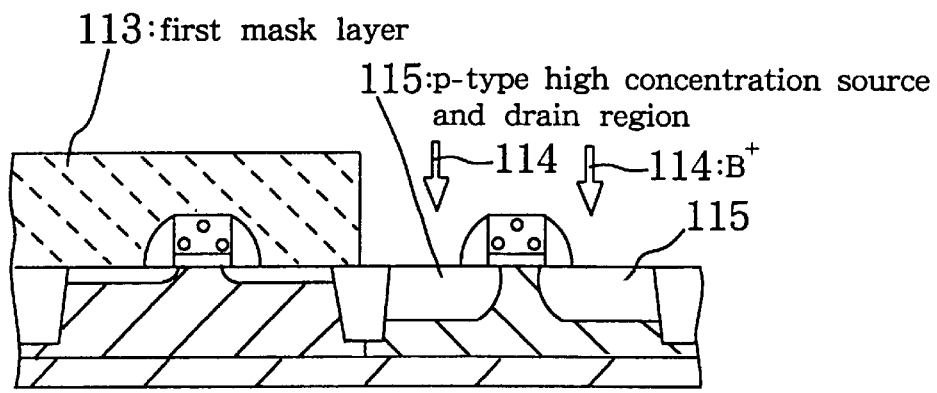
Figure 3F:
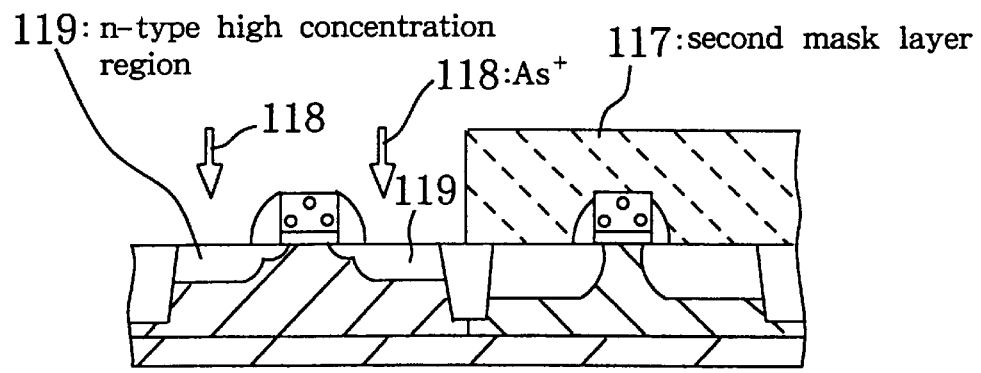

FIGS. 2(*a*) to (*g*) are sectional views showing a manufacturing process of a CMOS device in another embodiment of the present invention. First, a field oxidation film 22 is formed on a p-type Si substrate 21 as a base plane to determine regions of the device as shown in FIG. 2(*a*). Thereafter, an n-type well region 23 and a p-type well region 24 are formed. More specifically, the n-type well region 23 may be formed by ion-implanting $As^+$ under conditions of 100 KeV in energy and $5 \times 10^{12}$ cm$^{-2}$ in dose, for example, after ion-implanting such P+ thereon under conditions of 700 KeV in energy and $1.5 \times 10^{13}$ cm$^{-2}$ in dose. The p-type well region 24 may also be formed by ion-implanting $B^+$ thereon under conditions of 30 KeV in energy and $6 \times 10^{12}$ cm$^{-2}$ in dose, for example, after ion-implanting such $B^+$ under conditions of 300 KeV in energy and $2 \times 10^{13}$ cm$^{-2}$ in dose. Subsequently, after forming a gate oxidation film 25 as much as 6 nm thick by the thermal oxidation method, a non-doped polysilicon is deposited thereon as much as 200 nm thick by the CVD method. Both a gate electrode 26 of nMOSFET and a gate electrode 27 of pMOSFET are then formed by the photolithography process and etching process.

Thereafter, as shown in FIG. 2(*b*), $As^+$ 28 is ion-implanted onto both the n-type well region 23 and the p-type well region 24 with use of the gate electrodes 26, 27 and the field oxidation film 22 as a mask under conditions of 10 KeV in energy and $3 \times 10^{13}$ cm$^{-2}$ in dose to thereby form n-type low concentration regions 31 and 32 in both an nMOSFET forming region 29 and a pMOSFET forming region 30. After that, the heat treatment is carried out under condition as much as 1000° C. for 10 sec. in a nitrogenous atmosphere.

As shown in FIG. 2(*c*), a $SiO_2$ film is then deposited on the entire surface of p-type Si substrate 21 in as much as 100 nm thick by the CVD method. Thereafter, an anisotropic etching process is carried out to form side-wall spacers 33, 33 composed of $SiO_2$ in as much as 80 nm wide at the side surfaces of gate electrodes 26, 27.

After that, as shown in FIG. 2(*d*), a first mask layer 34 composed of a photoresist is coated on the pMOSFET forming region 30, and $As^+$ 35 is then ion-implanted thereon under conditions of 50 KeV in energy and $3 \times 10^{15}$ cm$^{-2}$ in dose to form an n-type high concentration region 36.

As shown in FIG. 2(*e*), the first mask layer 34 is then removed, and after coating a second mask layer 37 composed of the photoresist on the nMOSFET forming region 29, $BF_2^+$ 38 is ion-implanted thereon in an inclined direction under conditions of 5 KeV in energy, $1 \times 10^{15}$ cm$^{-2}$ in dose and 45° in implantation angle. With the ion-implantation in the inclination, damage layers 39, 39 are formed through the surfaces of side-wall spacers of the pMOSFET in as much as 20 nm deep. At this time, $BF_2^+$ does not reach the Si substrate adjacent to the gate electrodes through the side-wall spacers 33, 33 since the implantation energy is low such as 5 KeV, or extremely small even if it is reached thereto.

Thereafter, a wet etching is carried out by the dilute hydrogen fluoride solution of 1% for as much as 30 sec. as shown in FIG. 2(*f*). An etching rate for $SiO_2$ is 4 nm/min. in case of using such solution, but it becomes as much as twenty times at the portions of damage layers 39, 39 of the side-wall spacers, so that the damage layers 39, 39 can be formed by a good controllable etching so as to make about 20 nm in depth of the side-wall spacers of the pMOSFET.

$BF_2^+$ 40 is then ion-implanted thereon under conditions of 20 KeV in energy and $3 \times 10^{15}$ cm$^{-2}$ in dose to form a $p^+$-type source and drain region 41 as shown in FIG. 2(*g*). With the ion-implantation for forming the source and drain region, the n-type low concentration region 32 present in the pMOSFET forming region 30 can be inverted to a p-type region.

The second mask layer 37 is then removed, and after carrying out an activated heat treatment under conditions at 1000° C. for 10 sec. in nitrogenous atmosphere, a silicide layer, an insulation layer in between the layers and wiring are formed by general methods well known in the art.

In the case of embodiments described above, the $p^+$-type source and drain region is formed after forming the n-type high concentration region, but they may be formed by the other way around. In addition, the nMOSFET is formed of the LDD structure and the pMOSFET is formed of the single drain structure in the embodiments, but they may also be formed by the other way around, respectively.

It is thus apparent that the present invention is not limited to the above embodiments but may be changed and modified without departing from the scope and spirit of the invention.

Finally, the present application claims the priority of Japanese Patent Application No. Hei9-23604 filed Feb. 6, 1997, which is herein incorporated by reference.

What is claimed is:

1. A CMOS device including a first conductive type channel MOSFET having first side-wall spacers on side surfaces and having a source and drain region of an LDD structure; and a second conductive type channel MOSFET having second side-wall spacers on side surfaces and having a source and drain region of a single drain structure, wherein:

a width of the first side-wall spacers is larger than that of the second side-wall spacers, and a junction depth of the source and drain region in the first conductive type channel MOSFET is larger than that of the source and drain region in the second conductive type channel MOSFET.

2. A CMOS device according to claim 1, wherein the first conductive type channel MOSFET has a gate electrode, the side surfaces of which have the first side-wall spacers, respectively.

3. A CMOS device according to claim 1, wherein the second conductive type channel MOSFET has a gate electrode, the side surfaces of which have the second side-wall spacers, respectively.

4. A CMOS device comprising:

a first conductive type channel MOSFET having a gate electrode, side surfaces of which have first side-wall spacers and having a source and drain region of an LDD structure; and a second conductive type channel MOSFET having a gate electrode, side surfaces of which have second side-wall spacers and having a source and drain region of a single drain structure;

wherein a width of the first side-wall spacers is larger than that of the second side-wall spacers; and a junction depth of the source and drain region in the first conductive type channel MOSFET is larger than that of the source and drain region in the second conductive type channel MOSFET.

5. A CMOS device according to claim 4, wherein the side-wall spacers are layers composed of $SiO_2$.

* * * * *